(12) United States Patent
Sekine et al.

(10) Patent No.: US 8,029,152 B2
(45) Date of Patent: Oct. 4, 2011

(54) PACKAGE FOR LIGHT-EMITTING DEVICE, LIGHT-EMITTING APPARATUS, AND ILLUMINATING APPARATUS

(75) Inventors: Fumiaki Sekine, Mito (JP); Daisuke Sakumoto, Higashiomi (JP); Yuki Mori, Higashiomi (JP); Mitsuo Yanagisawa, Higashiomi (JP); Shingo Matsuura, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 530 days.

(21) Appl. No.: 11/909,592

(22) PCT Filed: Mar. 23, 2006

(86) PCT No.: PCT/JP2006/305846
§ 371 (c)(1),
(2), (4) Date: Dec. 10, 2008

(87) PCT Pub. No.: WO2006/101174
PCT Pub. Date: Sep. 28, 2006

(65) Prior Publication Data
US 2009/0296367 A1    Dec. 3, 2009

(30) Foreign Application Priority Data

Mar. 24, 2005  (JP) .................................. 2005-085367
Oct. 27, 2005  (JP) .................................. 2005-312710

(51) Int. Cl.
F21V 9/16    (2006.01)
(52) U.S. Cl. ............................. 362/84; 362/302; 362/297
(58) Field of Classification Search ............... 362/84, 362/293, 297, 302
See application file for complete search history.

(56) References Cited

U.S. PATENT DOCUMENTS

| 6,897,490 B2 | 5/2005 | Brunner et al. ............... 257/98 |
| 2002/0079837 A1 | 6/2002 | Okazaki |
| 2003/0146690 A1 | 8/2003 | Ellens et al. ............... 313/503 |
| 2004/0036081 A1 | 2/2004 | Okazaki |
| 2004/0070337 A1* | 4/2004 | Goh et al. .................. 313/512 |

FOREIGN PATENT DOCUMENTS

| DE | 19536454 A1 | 4/1997 |
| DE | 10020465 A1 | 11/2001 |
| JP | 10-107325 | 4/1998 |

(Continued)

OTHER PUBLICATIONS

Korean language office action and its English language translation for corresponding Korean application 2007-7024454.
German language office action and its English language translation for corresponding German application 112006000694.0 lists the references above.

(Continued)

Primary Examiner — Evan Dzierzynski
(74) Attorney, Agent, or Firm — DLA Piper LLP (US)

(57) ABSTRACT

A package includes a base body having a mounting portion for mounting a light-emitting device, a frame-shaped first reflection member attached to the upper surface of the base body, an inner peripheral surface of which is shaped into a first light reflecting surface and surrounds the mounting portion, and a frame-shaped second reflection member attached to the upper surface of the base body, with a spacing secured between an inner peripheral surface of the second reflection member and an outer peripheral surface of the first reflection member, the inner peripheral surface surrounding the first reflection member and having a second light reflecting surface at a location above an upper end of the first reflection member.

15 Claims, 8 Drawing Sheets

FOREIGN PATENT DOCUMENTS

| | | |
|---|---|---|
| JP | 2000-156528 | 6/2000 |
| JP | 2002185046 A | 6/2002 |
| JP | 2004-207258 | 7/2004 |
| JP | 2004-207672 | 7/2004 |
| JP | 2005-039194 | 2/2005 |

OTHER PUBLICATIONS

Japanese language office action dated Jun. 28, 2011 and its English language translation for corresponding Japanese application 2007509332 cites the foreign patent document above.

* cited by examiner

US 8,029,152 B2

PACKAGE FOR LIGHT-EMITTING DEVICE, LIGHT-EMITTING APPARATUS, AND ILLUMINATING APPARATUS

CROSS-REFERENCE TO THE RELATED APPLICATIONS

This application is a national stage of the international application No. PCT/JP2006/305846 filed Mar. 23, 2006, which is also claims benefit of priority under 35 USC §119 to Japanese Patent Application No. 2005-085367 filed Mar. 24, 2005 and Japanese Patent Application No. 2005-312710 filed Oct. 27, 2005, the entire contents of which are incorporated by reference.

TECHNICAL FIELD

The present invention relates to a package for a light-emitting device and a light-emitting apparatus employing the same for radiating light emitted from a light-emitting device to the outside after performing wavelength conversion thereon by means of a fluorescence, as well as to an illuminating apparatus.

BACKGROUND ART

A light-emitting apparatus of conventional design is mainly constructed of a package for a light-emitting device (hereafter also referred to simply as a "package"), a light-emitting device, and a light-transmittable member. The package is composed of a base body and a reflection member. The reflection member is formed in the shape of a frame, the inner peripheral surface of which is shaped into a reflecting surface for reflecting the light emitted from the light-emitting device.

In this light-emitting apparatus, the light-emitting device is allowed to emit light by a driving current supplied from an external electric circuit. In recent years, such a light-emitting apparatus has come to be utilized as a light source for illumination purposes, and this trend has created a demand for a light-emitting apparatus which exhibits excellent distribution of luminous intensity and heat dissipation capability in an operating state. Moreover, in the case of using the light-emitting apparatus as a light source for illumination purposes, its service lifespan is of particular importance. Consequently, not only a brightness of higher level but also a longer lifetime has been demanded of the light-emitting apparatus.

In light of the foregoing, nowadays, research and study have been made to come up with a variety of configurations of the reflection member for attaining a stable luminous intensity distribution in the light-emitting apparatus.

Japanese Unexamined Patent Publication JP-A 10-107325 (1998) discloses a related art.

However, the above-described conventional light-emitting apparatus poses the following problems. That is, in the case of bonding a large-volume reflection member having an reflecting surface which exhibits desired reflection characteristics, the base body and the reflection member suffer from troubles such as a stress and a bending moment caused by a difference in thermal expansion coefficient, during for example, the process of package production or the operation of the light-emitting apparatus. Sometime, it causes the package an insufficient hermetic sealing.

DISCLOSURE OF INVENTION

The invention has been devised in view of the above-described problems with the related art, and accordingly its object is to provide a light-emitting apparatus having excellent hermeticity in which variation in distribution of luminous intensity resulting from, for example, a difference in thermal expansion coefficient can be suppressed successfully.

The invention provides a package for a light-emitting device comprising:

a base body having a mounting portion on its upper surface for mounting a light-emitting device;

a frame-shaped first reflection member attached to the upper surface of the base body, an inner peripheral surface of which is shaped into a first light reflecting surface and surrounds the mounting portion; and a frame-shaped second reflection member attached to the upper surface of the base body, with a spacing secured between the an inner peripheral surface of the second reflection member and an outer peripheral surface of the first reflection member, the inner peripheral surface surrounding the first reflection member and having a second light reflecting surface which has a same axis as that of the first reflecting surface, at a location above an upper end of the first reflection member.

In the invention, it is preferable that the first reflection member is so designed that, given the height of the first reflection member of Y1, the height at the lower end of the second light reflecting surface of Y2, and the height of the second reflection member of Y3, then the following relationship holds: $Y2 \leq Y1 < Y3$.

In the invention, it is preferable that the base body and the first reflection member are each formed of ceramics.

In the invention, it is preferable that the base body and the first reflection member are each formed of ceramics of light color.

In the invention, it is preferable that the second reflection member is formed of aluminum.

The invention provides a light-emitting apparatus comprising:

the package for a light-emitting device mentioned above;

a light-emitting device mounted on the mounting portion; and a light-transmittable member disposed inside the first reflection member so as to cover the light-emitting device.

The invention provides a light-emitting apparatus comprising:

the package for a light-emitting device mentioned above;

a light-emitting device mounted on the mounting portion; and a fluorescent layer attached to the second reflection member so as to stop up the opening portion of the second reflection member, for effecting wavelength conversion on a part or the whole of light emitted from the light-emitting device.

In the invention, it is preferable that the light-emitting device is designed to give forth light in a range of at least from an ultraviolet region to a blue region.

The invention provides an illuminating apparatus comprising:

the light-emitting apparatus mentioned above;

a driving section on which is mounted the light-emitting apparatus, which has an electrical wiring for driving the light-emitting apparatus; and light reflecting means for reflecting light emitted from the light-emitting apparatus.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
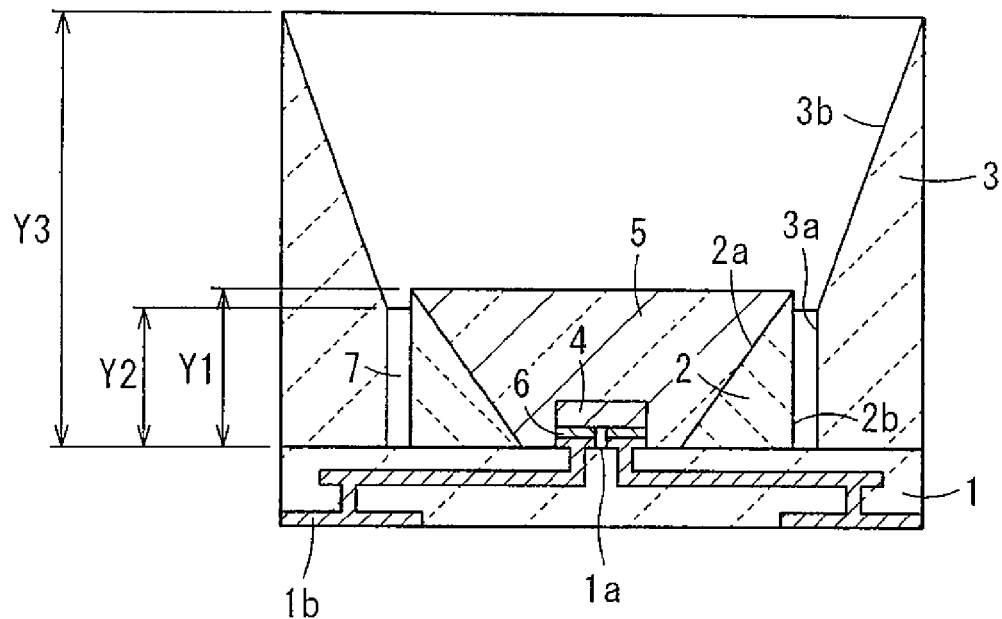
FIG. 1 is a sectional view showing a package for a light-emitting device and a light-emitting apparatus employing the same in accordance with a first embodiment of the invention.

Now referring to the drawings, preferred embodiments of the invention are described below.

Now, a detailed description will be given below as to a package for a light-emitting device and a light-emitting apparatus employing the same, and an illuminating apparatus according to the invention. FIG. 1 is a sectional view showing the light-emitting apparatus in accordance with a first embodiment of the invention. In this figure, the package for a light-emitting device is constructed mainly of a base body 1, a first reflection member 2, and a second reflection member 3. Moreover, the light-emitting apparatus for housing therein a light-emitting device 4 is constructed by disposing mainly the light-emitting device 4 and a light-transmittable member 5 in the package of the invention. The light-transmittable member 5 is disposed inside the first reflection member 2 so as to cover the light-emitting device 4.

The base body 1 is made of a ceramic material such as sintered aluminum oxide (alumina ceramics), sintered aluminum nitride, and glass ceramics, or a resin material. In the center of the upper surface of the base body 1, a mounting portion 1a is laid on which the light-emitting device 4 is to be mounted. Moreover, in the vicinity of the mounting portion 1a is formed one end of a wiring conductor 1b which is led out to the outside of the package. Note that the mounting portion 1a may also be formed on the upper surface of a projection which is disposed on the upper surface of the base body 1.

The wiring conductor 1b is formed of a layer metallized with W, Mo, Mn, or Cu, for instance. For example, a metal paste obtained by admixing a solvent and a plasticizer in powdery W or the like metal is print-coated in a predetermined pattern, and is then calcined at a high temperature. In this way, the wiring conductor 1b is formed in the base body 1. It is preferable that the wiring conductor 1b has its surface clad with a metal layer such as a 0.5 to 9 μm-thick Ni layer or a 0.5 to 5 μm-thick Au layer by means of plating, for the sake of preventing occurrence of oxidative corrosion and strengthen the connection with a bonding wire (not shown in the figure) as well as an electrically conductive member 6.

Moreover, the other end of the wiring conductor 1b is led out to the outer surface of the light-emitting apparatus via a conductor layer formed inside the base body 1 to establish connection with an external electric circuit. With this configuration, the wiring conductor 1b has the capability of providing electrical connection between the light-emitting device 4 and the external electric circuit.

Moreover, the base body 1 functions as a support member for supportably mounting thereon the light-emitting device 4. On the upper surface of the base body 1 is formed the mounting portion 1a on which the light emitting device 4 is to be mounted. The light-emitting device 4 is attached thereto through the use of a resin adhesive or a brazing filler material having a low melting point such as tin (Sn)-lead (Pb) solder or Au—Sn solder.

Further, the base body 1 has formed on its upper surface the first reflection member 2 and the second reflection member 3. The first reflection member 2 is attached thereto so as to surround the mounting portion 1a on which is mounted the light-emitting device 4 through the use of a bonding compound made of solder, a brazing filler material such as Ag brazing filler, or a resin adhesive such as epoxy resin, acrylic resin, or silicone resin. The second reflection member 3 is attached thereto so as to surround the first reflection member 2, with a spacing 7 secured between the second reflection member 3 and an outer peripheral surface 2b of the first reflection member 2, through the use of a bonding compound made of solder, a brazing filler material such as Ag brazing filler, or a resin adhesive such as epoxy resin, acrylic resin, or silicone resin.

The first reflection member 2 has its inner peripheral surface which faces the light-emitting device 4 and is shaped into a first light reflecting surface 2a. Inside the first light reflecting surface 2a, a hollow portion is created by the presence of the base body 1 and the first reflection member 2. The light-transmittable member 5 is injected into the hollow portion so as to cover the light-emitting device 4. The light-transmittable member 5 contains a fluorescent substance (not shown in the figure) which gives forth light after being excited by the light emitted from the light-emitting device 4. Note that the inner peripheral surface of the first reflection member 2 is shaped into a slanted surface whose upper end spreads outward beyond the lower end thereof. On this slanted surface is formed the first light reflecting surface 2a. Moreover, although there is no particular limitation to the shapes of the outer peripheral surface 2b and the inner peripheral surface of the first reflection member 2 as viewed plane-wise, for example, these surfaces are given a polygonal shape, a circular shape, or an elliptical shape.

The second reflection member 3 of the invention has an inner peripheral surface 3a and a second reflecting surface 3b located above the inner peripheral surface 3a. The inner peripheral surface 3a of the second reflection member 3 is so formed as to surround the outer peripheral surface 2b of the first reflection member 2, with the spacing 7 secured therebetween. The second reflecting surface 3b exercises light distribution control over the light emitted from the light-transmittable member 5 or the light-emitting device 4 at least in a region above the upper end of the first reflection member 2. Moreover, the second reflecting surface 3b is shaped into a slanted surface whose upper end spreads outward beyond the lower end thereof. Note that, although there is no particular limitation to the shapes of the outer peripheral surface and the inner peripheral surface 3a of the second reflection member 3 as viewed plane-wise, for example, these surfaces are given a polygonal shape, a circular shape, or an elliptical shape. The inner peripheral surface 3a does not necessarily have to be disposed in coaxial relation with respect to the outer peripheral surface 2b of the first reflection member 2, but in general is formed coaxially therewith in the shape of a polygon, a circle, an ellipse, or the like.

The second reflection member 3 is attached to the upper surface of the base body 1 in such a manner that the spacing 7 is secured between the outer peripheral surface 2b of the first reflection member 2 and the inner peripheral surface 3a of the second reflection member 3. In this case, during heating and cooling operations performed in the course of manufacture of the package or at the time of the actuation of the light-emitting apparatus, it is possible to alleviate a thermal stress which is caused by thermal expansion and thermal contraction that the base body 1, the first reflection member 2, and the second reflection member 3 undergo due to the heat liberated by the light-emitting device 4 and an ambient temperature at which the package is operated. That is, since the reflection member is divided into two pieces 2 and 3, it follows that the first reflection member 2 and the second reflection member 3 each have a smaller volume and are correspondingly subjected to lesser degree of thermal expansion or thermal contraction. Moreover, with the provision of the spacing 7 between the first reflection member 2 and the second reflection member 3, even if the first reflection member 2 and the second reflection member 3 undergo thermal expansion, a stress developed inside each of the first reflection member 2 and the second reflection member 3 due to press mutually between the reflection members 2 and 3 and a deformation resulting from the stress can be accommodated by the spacing 7. This makes it possible to lessen a force which is exerted upon the base body 1.

Figure 11:
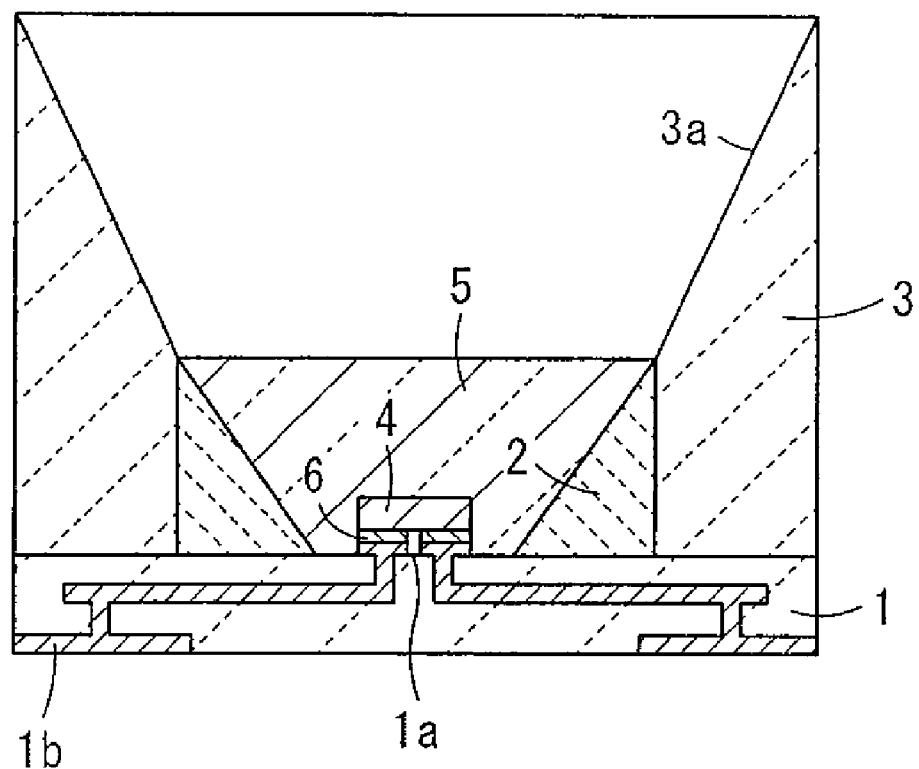
FIG. 11 is a sectional view showing an example of a conventional light-emitting apparatus.

As shown in FIG. 11, it is possible to suggest the package of another type in which the first reflection member 2 and the second reflection member 3 are provided independently of each other, but the outer peripheral surface 2b of the first reflection member 2 and the inner peripheral surface 3a of the second reflection member 3 are kept in contact with each other. Also in this case, it is possible to achieve a certain degree of success in suppressing variation in distribution of luminous intensity in the light-emitting apparatus that caused by the change in shape of the first reflection member 2 and the second reflection member 3 imposed by mutual stresses therebetween in accompaniment with thermal expansion and thermal contraction that are caused under the influence of, for example, heating and cooling operations performed in the course of manufacture of the package or the application of heat generated at the time of the actuation of the light-emitting apparatus.

However, by adopting the configuration as shown in FIG. 1, it is possible to alleviate, more ideally, a horizontally applied stress which is ascribable to the difference in thermal expansion coefficient between the base body 1 and the first and second reflection members 2 and 3, and thereby alleviate a bending moment which is exerted upon the base body 1 under the action of the first reflection member 2 and the second reflection member 3. This makes it possible to reduce the stress concentrated in the midportion of the base body 1 and thereby prevent occurrence of a crack in the base body 1. Moreover, the base body 1 and the first and second reflection members 2 and 3 can be prevented from separating from each other. As a result, it never occurs that the wiring conductor 1b formed in the base body 1 suffers from a trouble such as a break. Therefore, in the light-emitting apparatus, stable power supply for the light-emitting device 4 can be maintained. Since the first and second reflection members 2 and 3 are free of, for example, falling-off from the base body 1, it is possible to retain satisfactory hermeticity required of the package, and thereby attain excellent long-term reliability. Moreover, it hardly occurs that the light-transmittable member 5 filled inside the first reflection member 2 suffers from a surface deformation and that the angle of inclination between the first light reflecting surface 2a and the second light reflecting surface 3b is caused to change. Accordingly, the light-emitting apparatus is designed to be capable of effecting light emission with a desired distribution of luminous intensity.

Moreover, the reflection member is divided into two pieces 2 and 3, namely the first reflection member 2 and the second reflection member 3. In this case, the first reflection member 2 and the second reflection member 3 are allowed to exercise light distribution control on an individual basis over the light emitted from the phosphor or the fluorescent substance-containing light-transmittable member 5 as well as the light-emitting device 4. Even if the light-emitting apparatus is loaded with the heat liberated by the light-emitting device 4 and the heat originating from the ambient temperature or the like, since the first reflection member 2 and the second reflection member 3 are arranged at the spacing 7, it is possible to reduce adverse effects such as a deformation resulting from the mutual actions of the first reflection member 2 and the second reflection member 3 under the influence of thermal expansion, and thereby prevent variation in luminous characteristics and light distribution characteristics that is caused by the deformation.

That is, for example, it is assumed that the first reflection member 2 having filled in its inside the light-transmittable member 5 disposed so as to surround the light-emitting device 4 in proximity is defined as a light emitting portion, and that the second reflection member 3 disposed at a distance from the light-emitting device 4 so as to surround the outer peripheral surface 2b of the first reflection member 2 is defined as a light distribution control portion. Then, the first reflection member 2 and the second reflection member 3 are so arranged as to function independently of each other. In this case, that part of the second reflection member 3 which provides the light-distribution control capability is less prone to the transmission of heat emanated from the light-emitting device 4 through the first reflection member 2, and further that part of the second reflection member 3 which is attached to the outer periphery of the base body 1 is also less prone to the transmission of heat emanated from the light-emitting device 4. In consequence whereof there results little deformation in the second reflection member 3 due to the heat emanated from the light-emitting device 4, wherefore the light distribution characteristics of the light-emitting apparatus can be stabilized during the operation of the light-emitting device 4. As a result, the light-emitting apparatus of the invention suffers little from variation in light distribution characteristics, color rendition, and luminous characteristics in an operating state, and stability can thus be achieved.

Moreover, according to the invention, even if the reflection member is formed of a metal material such as Al or Ag that is high in reflectivity but is low in Vickers hardness number and is thus liable to variation in distribution of luminous intensity, it is possible to provide stable optical characteristics.

Further, by providing the spacing 7 between the first reflection member 2 and the second reflection member 3, it is possible to increase the surface areas of the first reflection member 2 and the second reflection member 3 to be exposed to the air outside. This makes it possible to attain enhanced heat dissipation capability by exploiting a current of air around the light-emitting apparatus. It is needless to say that the embodiment of the invention may be so designed that, for example, an elastic member having high thermal conductivity is charged into the spacing 7 whereby to dissipate the heat emanated from the light-emitting device 4 through the first reflection member 2 and the second reflection member 3. In this case, the light-emitting apparatus can be cooled down more successfully, wherefore neither the luminous efficiency nor the lifespan of the light-emitting device 4 will be impaired. As another advantage, the luminous wavelength can be prevented from being shifted to a long wavelength region.

Moreover, as shown in FIG. 1, it is preferable that, given the height of the outer periphery of the first reflection member 2 of Y1, the height at the lower end of the second light reflecting surface 3*b* of Y2, and the height of the second reflection member 3 of Y3, then the following relationship holds: Y2≦Y1<Y3. In this case, the light emitted from the light-emitting device 4 as well as the fluorescent substances of the light-transmittable member 5, which is caused to exit sidewardly of the first reflection member 2, illuminates on the second light reflecting surface 3*b* located in the upper part of the second reflection member 3 at all times. Accordingly, light distribution can be controlled by the second reflection member 3, whereby making it possible to attain a desired luminous intensity distribution for the light-emitting apparatus.

Figure 2:
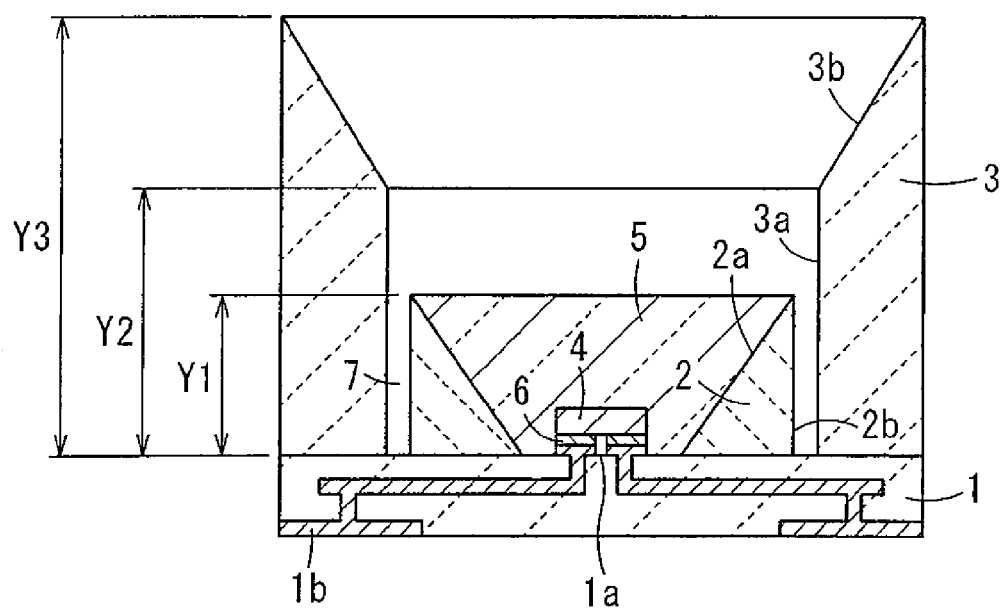
FIG. 2 is a sectional view showing a package for a light-emitting device and a light-emitting apparatus employing the same in accordance with a second embodiment of the invention.
Figure 3:
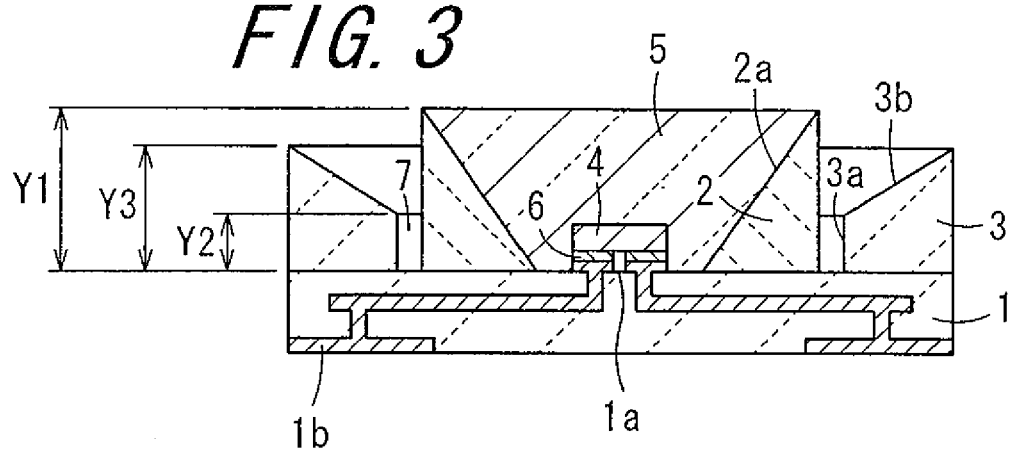
FIG. 3 is a sectional view showing a package for a light-emitting device and a light-emitting apparatus employing the same in accordance with a third embodiment of the invention.

For example, as seen in FIG. 2 showing a second embodiment of the invention, in a case where the relationship between the height Y1 of the first reflection member 2 and the height Y2 at the lower end of the second light reflecting surface 3*b* is given as: Y2>Y1, part of the light emitted from the light-emitting device 4 or the fluorescent substances contained in the light-transmittable member 5 is not applied to the second light reflecting surface 3*b* but applied to the inner peripheral surface 3*a*. The light incident on the inner peripheral surface 3*a* is dispersed, thus broadening the distribution of luminous intensity in the light-emitting apparatus. Furthermore, the dispersion of light gives rise to lack of uniformity in luminosity. In addition, as seen in FIG. 3 showing a third embodiment of the invention, in a case where the relationship between the height Y1 of the first reflection member 2 and the height Y3 of the second reflection member 3 is given as: Y1>Y3, no light is applied to the second light reflecting surface 3*b* of the second reflection member 3. In this case, the light-emitting apparatus is incapable of effecting emission of highly directional light.

Moreover, it is preferable that the first reflection member 2 is so designed that the first light reflecting surface 2*a* exhibits a light reflectivity of 90% or above. In this case, it is possible to increase the quantity of light which is reflected from the first light reflecting surface 2*a* for effecting excitation of the fluorescent substances, and thereby increase the quantity of light which is generated from the fluorescent substances contained in the light-transmittable member 5. As another advantage, since the light emitted from the fluorescent substances as well as the light-emitting device 4 can be reflected upwardly with efficiency, it is possible to enhance the luminous efficiency of the light-emitting apparatus.

In a case where the first reflection member 2 is made of a metal material such as Al or Ag, the first light reflecting surface 2*a* is formed by polishing the inner peripheral surface of the first reflection member 2 to a mirror-smooth state through a polishing process such as a chemical polishing process or an electrolytic polishing process. In this case, it is possible to attain a light reflectivity of 90% or above. In a case where the first reflection member 2 is made of a stainless steel (SUS), an Iron (Fe)—Ni-cobalt (Co) alloy, a Fe—Ni alloy, ceramics, resin, or the like material which exhibits a relatively low reflectivity even in a mirror-finished state, the first light reflecting surface 2*a* can be obtained by forming, on the inner peripheral surface of the first reflection member 2, a mirror-finished surface made of a thin metal layer such as Al, Ag, gold (Au), platinum (Pt), titanium (Ti), chromium (Cr), or copper (Cu) by means of plating, vapor deposition, or otherwise. Alternatively, for example, an approximately 1 to 10 μm-thick Ni plating layer and an approximately 0.1 to 3 μm-thick Au plating layer may be laminated successively on the surface by means of electrolytic plating or electroless plating. In this case, the corrosion resistance of the first light reflecting surface 2*a* can be improved, and a deterioration in the reflectivity thereof can be prevented. Besides, in a case where the first reflection member 2 is made of resin, with use of a resin material having a high reflectivity such as a resin material in which is dispersed a filler made of titanium oxide (titania) or fluorine-base TEFLON (registered trademark) resin, the first light reflecting surface 2*a* can be formed by performing a cutting process or a die-molding process on the first reflection member 2.

The second reflection member 3 exercises light distribution control in a manner whereby the light scattered from the light-transmittable member 5 is reflected from the second light reflecting surface 3*b*. Accordingly, the second reflection member 3 is formed by performing a cutting process, a die-molding process, or the like process on a metal, ceramics, or resin material having a high regular reflectance; that is, a metal material such as Al, Ag, Au, Pt, Ti, Cr, or Cu, a ceramics material such as sintered aluminum oxide or sintered zirconium oxide, or a resin material such as epoxy resin or liquid crystal polymer (LCP) resin. The second light reflecting surface 3*b* should preferably be shaped into a reflecting surface in which the regular reflectance is larger than the diffuse reflectance. In this regard, it is desirable to form the second light reflecting surface 3*b* with use of a metal material rather than a resin or ceramics material.

The second light reflecting surface 3*b* is formed by giving a mirror-finishing to the second reflection member 3 formed by means of cutting, die molding, or otherwise, through a polishing process such as a chemical polishing process or an electrolytic polishing process. In a case where the second reflection member 3 is formed of an insulating material such as ceramics or resin, it is possible to form, on the second light reflecting surface 3*b*, a mirror-finished surface made of a thin metal layer such as Al, Ag, Au, Pt, Ti, Cr, or Cu by means of plating, vapor deposition, or otherwise. Alternatively, an approximately 1 to 10 μm-thick Ni plating layer and an approximately 0.1 to 3 μm-thick Au plating layer may be laminated successively on the surface by means of electrolytic plating or electroless plating (chemical plating). In this case, the corrosion resistance of the inner peripheral surface 3*a* can be improved, and a deterioration in the reflectivity of the second light reflecting surface 3*b* can be prevented.

Note that it is desirable to use a metal material having high thermal conductivity, such as Al, Ag, Au, or Cu, to form the first reflection member 2 and the second reflection member 3. By doing so, the heat dissipation capability of the light-emitting apparatus as a whole can be improved, wherefore the light-emitting device 4 is less prone to accumulation of heat. This makes it possible to maintain a satisfactory luminous efficiency and a long-term reliability in the light-emitting device 4, as well as to prevent a shifting of the central wavelength of light emission resulting from a temperature rise that the light-emitting device 4 undergoes.

Moreover, the first reflection member 2 and the second reflection member 3 may be formed of different materials. That is, in a case where the base body 1 is made of ceramics having a thermal expansion coefficient of $6 \times 10^{-6}/°$ C., and the first reflection member 2 or the second reflection member 3 is made of a metal member or resin having a thermal expansion coefficient which differs considerably from the thermal expansion coefficient of the base body 1, the difference in thermal expansion coefficient between the base body 1 and the first reflection member 2 or the second reflection member 3 is so great that, due to heating and cooling operations effected in the course of manufacture of the package or the heat liberated by the light-emitting device 4 in accompaniment with the actuation of the light-emitting apparatus and an ambient temperature at which the light-emitting apparatus is operated, a higher stress is applied between the base body 1 and the first reflection member 2 or the second reflection member 3. In consequence whereof there results a crack in the base body 1, and a crack or separation in the joint portion between the base body 1 and the first reflection member 2 or the second reflection member 3. Accordingly, it is desirable to use, as the first reflection member 2 or the second reflection member 3, a material which is closely analogous in thermal expansion coefficient to the base body 1, for example, Cr (thermal expansion coefficient: $6.8 \times 10^{-6}/°$ C.) or silicon carbide (SiC) (thermal expansion coefficient: $6.6 \times 10^{-6}/°$ C.), or a material having a high Young's modulus, for example, Fe (192.2 GPa) or Ti (104.3 GPa), or a material which is high both in Young's modulus and in reflectivity such as Al or Ag. The use of such a material as the first reflection member 2 or the second reflection member 3 makes it possible to prevent development of a stress resulting from the difference in thermal expansion coefficient between the base body 1 and the first reflection member 2 or the second reflection member 3, as well as to lessen the degree of warping occurring in the base body 1. Consequently, the first and second light reflecting surfaces 2a and 3b suffer little from variation in the angle of reflection.

Moreover, it is preferable that the base body 1 and the first reflection member 2 of the invention are each made of ceramics. By using ceramics to form the base body 1, it is possible to reduce the difference in thermal expansion coefficient between the base body 1 and the light-emitting device 4, and thereby suppress development of a stress between the base body 1 and the light-emitting device 4 due to the heat emanated from the light-emitting device 4 and the heat originating from the ambient conditions. Moreover, with the base body 1 and the first reflection member 2 made of ceramics, it is possible to suppress development of a stress at the joint portion between the base body 1 and the first reflection member 2 due to the difference in thermal expansion coefficient between the base body 1 and the first reflection member 2, as well as to prevent occurrence of a stress-induced deformation in the first light reflecting surface 2a. Besides, in this case, in contrast to the case of using resin to form the base body 1 and the first reflection member 2, it is possible to avoid problems such as a deterioration in the reflectivity and water-resistance of the base substrate 1 and the first light reflecting surface 2a resulting from a moisture content or heat in the operating environment or the heat or light emanated from the light-emitting device 4. As a result, in the light-emitting apparatus, the light-emitting device 4 can be operated with stability while a reduction in optical power level can be prevented for a longer period of time.

In a case where the light-emitting device 4 is composed of a gallium nitride-based compound semiconductor, as a substrate on which is formed a light emitting layer thereof, a sapphire substrate having a thermal expansion coefficient of approximately $5 \times 10^{-6}/°$ C. is used. Moreover, in a case where the light-emitting device 4 is composed of a gallium arsenide-based compound semiconductor, the gallium arsenide-based compound semiconductor exhibits a thermal expansion coefficient of approximately $6 \times 10^{-6}/°$ C. Further, in a case where sintered aluminum oxide is used to form the base body 1 and the first reflection member 2, since the thermal expansion coefficient of sintered aluminum oxide is approximately $6 \times 10^{-6}/°$ C., it is possible to reduce the difference in thermal expansion coefficient from the light-emitting device 4. By way of contrast, in a case where the base body 1 is made of epoxy resin or liquid crystal polymer (LCP) resin, the thermal expansion coefficient thereof is approximately $20 \times 10^{-6}/°$ C. In this case, the difference in thermal expansion coefficient from the light-emitting device 4 is so great that a stress is concentrated at the joint portion between the base body 1 and the light-emitting device 4. This leads to a failure in electrical connection in the light-emitting apparatus in which the light-emitting device 4 is flip-chip mounted. Consequently, there arises a possibility that the light-emitting device 4 cannot be operated properly.

Furthermore, the stress developed at the joint portion between the base body 1 and the light-emitting device 4 is concentrated in the light emitting layer of the light-emitting device 4. In this case, the light-emitting device 4 suffers from a light wavelength deviation which is presumably caused by a piezoelectric effect, and also there arise problems involved in the light emitted from the light-emitting apparatus such as a change of light color, variation in light intensity, and emission of nonuniform light. This makes it difficult to obtain satisfactory illumination light required of a light source for use in the illuminating apparatus. On the other hand, by virtue of its stability in material quality, ceramics lends itself to the prevention of a decline in the reflectivity of the first light reflecting surface 2a resulting from the temperature of the operating environment, a moisture content, and the like environmental factors. Accordingly, with the use of ceramics, the package and the light-emitting apparatus can be so designed that the light-emitting device 4 is operated with stability while a reduction in optical power level can be prevented for a longer period of time, and designed to effect light emission with stable color characteristics.

Besides, it is more preferable that the base body 1 and the first reflection member 2 are each made of ceramics of light color or whitish color, for example, sintered aluminum oxide, sintered zirconium oxide (zirconia ceramics), sintered yttrium oxide (yttria ceramics), or sintered titanium oxide (titania ceramics) of which color is almost white. Note that light-color ceramics has a reflection characteristic such that a differential between a maximum value and a minimum value of the reflectivity in a range of at least from an ultraviolet region to a visible light region falls within a level of 10%.

In this way, by using ceramics to form the base body 1 and the first reflection member 2, even under the following circumstances: heat is repeatedly applied to the package in the course of its manufacture; the environment changes during the manufacturing process; and the elapsed time on the manufacturing process is prolonged, it is possible to prevent occurrence of a crack due to the stress concentrated at the joint portion between the base body 1 and the first reflection member 2, separation between the base body 1 and the first reflection member 2, and a deformation in the base body 1 and the first reflection member 2, as well as to suppress variation in reflectivity in the base body 1 and the first reflection member 2. Moreover, by using ceramics of white color, it is possible to achieve reflection of light in an efficient manner in a range of from an ultraviolet region to a visible light region, with lesser degree of the influence of wavelength dependence. As a result, the light-emitting apparatus is capable of functioning normally with stability for a longer period of time, and allows emission of light with little variation in optical power level and color.

Moreover, it is preferable that the second reflection member 3 is made of aluminum. The aluminum-made second reflection member 3 suffers little from a change in reflectivity by virtue of an oxidation layer produced by the effect of passivation. This makes it possible to manufacture the package which allows efficient emission of the light emitted from the light-emitting device with little decline in reflectivity caused by the operating environment. As another advantage, in the case of using aluminum, the dependence of reflectivity on wavelength in a range of from an ultraviolet region to a visible light region is so low that there is little decline in reflectivity with respect to light in a range of from an ultraviolet region to a near-ultraviolet region or a blue region. Moreover, it is possible to prevent a decline in reflectivity which is ascribable to corrosion caused by a moisture content and oxygen present in the operating environment, and thereby prevent a reduction in optical power level and a deterioration in long-term reliability in the light-emitting apparatus.

Moreover, with the use of the aluminum-made second reflection member 3, for example, in the case of using the light-transmittable first reflection member 2 made of sintered aluminum oxide or the like material, it is possible to cut off light which leaks outside of the light-emitting apparatus after passing through the side surface of the first reflection member 2. By doing so, when the light-emitting apparatus is used as a light source for display purposes, a higher degree of contrast can be ensured between the light-emitting surface and the non-light-emitting surface of the light-emitting apparatus. This makes it possible to manufacture a high-visibility light-emitting apparatus for use as a display light source. Further, in a case where the light-emitting device 4 is designed to give forth light in a range of from a blue region to an ultraviolet region, high-energy light transmitted through the first reflection member 2 can be cutoff. This makes it possible to manufacture a light-emitting apparatus which offers excellent environmental resistance without causing quality degradation in the surrounding members which are susceptible to deterioration from light.

The light-emitting device 4 is electrically connected to the wiring conductor 1b formed in the base body 1 by means of wire bonding (not shown in the figure) or flip-chip bonding. In the case of adopting the flip-chip bonding method, the light-emitting device 4 is arranged with the electrode portion side down, and the electrical connection is established by using the electrically conductive member 6 made of a solder material such as Au—Sn solder or Pb—Sn solder or electrically conductive resin such as a Ag paste.

It is more desirable to adopt the flip-chip bonding method for achieving the connection. By doing so, the wiring conductor 1b can be disposed immediately below the light-emitting device 4. This eliminates the need to secure an extra space for disposing the wiring conductor 1b around the light-emitting device 4 on the upper surface of the base body 1. It is thus possible to avoid that the light emitted from the light-emitting device 4 is absorbed in the wiring conductor 1b of the base body 1 that will eventually cause a decline in the intensity of radiation light. Moreover, the heat emanated from the light-emitting device 4 can be transmitted to the base body 1 through the wiring conductor 1b in an efficient manner. This makes it possible to effectively prevent a rise in temperature in the light-emitting device 4 during the operation of the light-emitting apparatus. Therefore, both reduction in luminous efficiency and variation in luminous wavelength can be prevented successfully.

In a case where the base body 1 is made of ceramics, the wiring conductor 1b is formed by creating a layer metallized with powdery metal such as W, Mo, Cu, or Ag on the surface and in the interior of the base body 1. On the other hand, in a case where the base body 1 is made of resin such as epoxy resin or LCP resin, the wiring conductor 1b is formed by burying therein a lead terminal made of a Fe—Ni—Co alloy or the like material, with its one end exposed at the mounting portion 1a. Alternatively, it is possible to fit an input/output terminal made of an insulator having formed therein the wiring conductor 1b into a through hole drilled in the base body 1.

Moreover, it is preferable that the wiring conductor 1b has its exposed surface coated with a highly corrosion-resistant metal such as Ni or Au in the thickness ranging from approximately 1 to 20 μm. This makes it possible to effectively protect the wiring conductor 1b against oxidative corrosion, as well as to strengthen the electrical connection between the light-emitting device 4 and the wiring conductor 1b. Accordingly, it is more preferable that the exposed surface of the wiring conductor 1b is clad with, for example, an approximately 1 to 10 μm-thick Ni plating layer and an approximately 0.1 to 3 μm-thick Au plating layer successively by the electrolytic plating method or electroless plating method.

The light-transmittable member 5 is made of transparent resin such as epoxy resin or silicone resin, or transparent glass. At first a fluidal transparent member containing a fluorescent substances is poured inside the first reflection member 2 so as to cover the light-emitting device 4 by using an injector such as a dispenser, and then heat is applied to cure the transparent member. In so doing there is formed the light-transmittable member 5. Moreover, in a case where the light-emitting device 4 is formed of GaN having a refractive index of 2.5 and the light-emitting device 4 is formed on a sapphire substrate having a refractive index of 1.7, with use of transparent resin or transparent glass having a refractive index which falls in a range of from 1 to 1.7, the difference in refractive index between the light-emitting device 4 or the substrate and the atmosphere of the light-emitting apparatus can be reduced. Therefore, a larger quantity of light can be produced through the light-emitting device 4. This makes it possible to manufacture a light-emitting apparatus which is capable of effecting emission of light having a desired wavelength spectrum by exploiting the light emitted from the fluorescent substances, with higher luminous intensity and significantly enhanced radiation light intensity and brightness.

Figure 4:
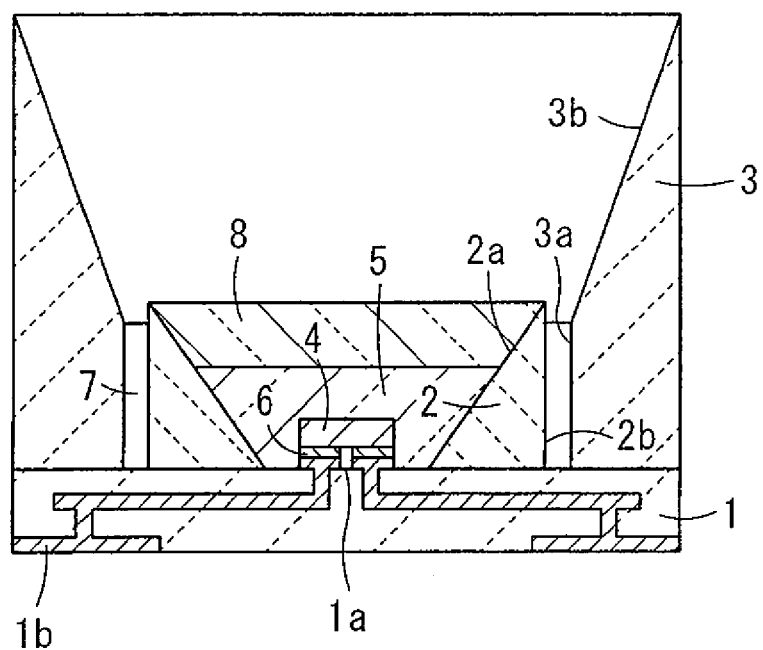
FIG. 4 is a sectional view showing a package for a light-emitting device and a light-emitting apparatus employing the same in accordance with a fourth embodiment of the invention.

Moreover, as seen in FIG. 4 showing a fourth embodiment of the invention, the light-transmittable member 5 may take on another structure; that is, the transparent light-transmittable member 5 is arranged inside the first reflection member 2, and a sheet-like layer 8 made of a transparent member containing a fluorescent substances is so arranged as to cover the upper surface of the light-transmittable member 5. In this case, in the absence of the fluorescent substances around the light-emitting device 4, it is possible to suppress confinement of light by the fluorescent substances, and thereby prevent occurrence of quality degradation in the resin material around the light-emitting device 4 and absorption loss of light. As a result, light can be produced through the light-emitting device 4 with high efficiency and the sheet-like phosphor layer 8 is irradiated with the light. Therefore, the optical power level of the light emitted from the fluorescent substances is raised, and it is possible to manufacture a light-emitting apparatus which gives forth light with high luminous efficiency and with little color unevenness.

Figure 5A:
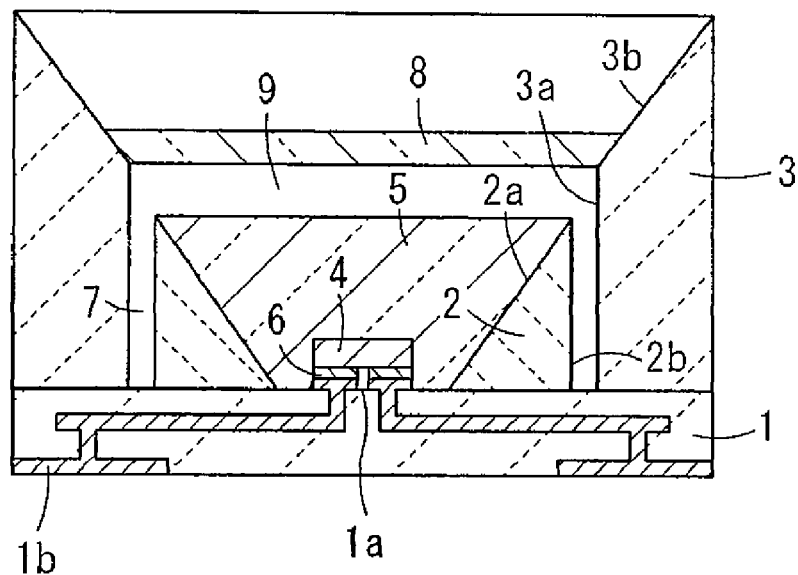
FIGS. 5A and 5B are a sectional view and a perspective view, partly in section, showing a package for a light-emitting device and a light-emitting apparatus employing the same in accordance with a fifth embodiment of the invention.
Figure 5B:
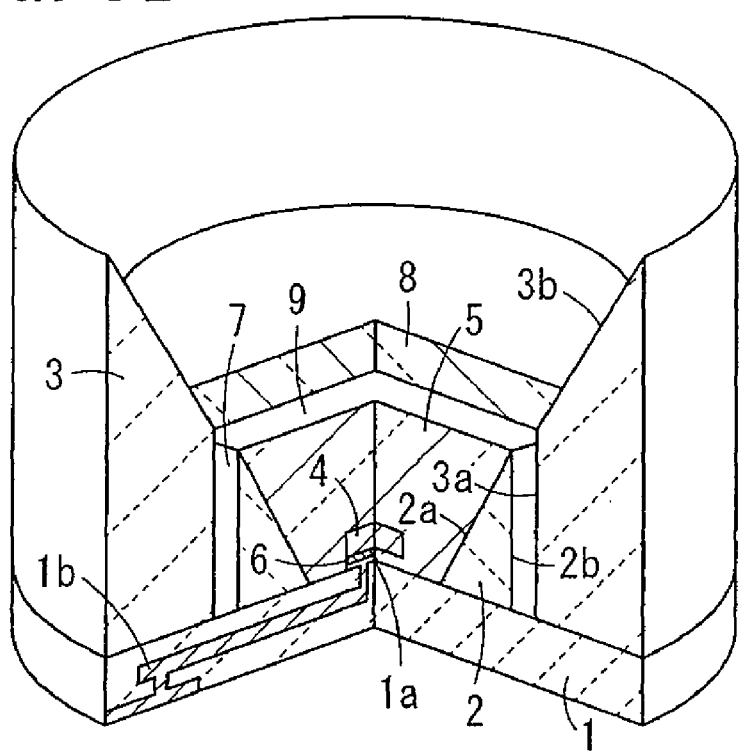

Moreover, by way of a fifth embodiment of the invention, as seen in FIG. 5A which is a sectional view of the embodiment and FIG. 5B which is a perspective view, partly in section, of the embodiment, it is preferable that the light-emitting apparatus is composed of the aforestated package, the light-emitting device 4 mounted on the mounting portion 1a, and the fluorescent substances layer 8 attached to the second reflection member 3 so as to stop up the opening portion of the second reflection member 3. The light emitted from the light-emitting device 4 is partly or wholly converted to the desired wavelength by the fluorescent substances layer 8. In this construction, it is possible to prevent deterioration in the characteristics of the fluorescent substances layer 8 which is ascribable to the heat liberated by the light-emitting device 4. That is, in the case of arranging the fluorescent substances layer 8 in the opening portion of the second reflection member 3, as compared with the case of arranging the fluorescent substances layer 8 inside the first reflection member 2 or arranging it so as to stop up the opening portion thereof, the path through which heat is dissipated from the light-emitting device 4 to the fluorescent substances layer 8 via the second reflection member 3 is so long that the fluorescent substances layer 8 is less prone to heat transmission from the light-emitting device 4.

In addition, the path through which heat is dissipated from the light-emitting device 4 to the fluorescent substances layer 8 via the first reflection member 2 is blocked by the spacing 7. Accordingly, since the fluorescent substances layer 8 is less prone to the transmission of heat emanated from the light-emitting device 4, even in the case of using epoxy resin, acrylic resin, silicone resin, or the like material as the transparent member containing a fluorescent substances, it is possible to prevent the transparent resin from becoming yellowish due to heat application, as well as to prevent a deterioration in transmittance. It is also possible to prevent a degradation in optical power level resulting from heat-induced acceleration of chemical reactions such as oxidation or reduction of the fluorescent substances charged in the fluorescent substances layer 8. As another advantage, the light emitted downwardly of the outer periphery of the lower surface of the fluorescent substances layer 8 and the light emitted sidewardly of the side surface of the fluorescent substances layer 8 are reflected from the upper end face of the first reflection member 2 and the second light reflecting surface 3b. In this case, the quantity of light emitted upward from the fluorescent substances layer 8 is increased, wherefore both the optical power level and the brightness of the light-emitting apparatus can be enhanced.

Moreover, at the time of forming the light-transmittable member 5 inside the first reflection member 2, even if there arises lack of uniformity in the shape of the surface of the light-transmittable member 5 caused by the surface tension, the fluorescent substances layer 8 attached to the second reflection member 3 so as to stop up the opening portion of the second reflection member 3 is kept out of contact with the surface of the light-transmittable member 5 of the first reflection member 2. Accordingly, for example, the fluorescent substances layer 8 formed in the shape of a sheet in advance can be arranged in the opening portion of the second reflection member 3 regardless of the surface shape of the light-transmittable member 5. This allows the light emitted from the light-emitting device 4 to radiate evenly, wherefore the light-emitting apparatus suffers little from color unevenness.

Note that, in order to control the distribution of luminous intensity of the light emitted from the light-emitting device 4 as well as the fluorescent substances layer 8 in a desired manner, the second light reflecting surface 3b may be shaped into a slanted surface whose upper end spreads outward beyond the lower end thereof. In this case, part of the light emitted from the fluorescent substances layer 8 is applied at least to the second light reflecting surface 3b. Accordingly, the second reflection member 3 is allowed to exercise light distribution control, wherefore a desired distribution of luminous intensity can be attained for the light-emitting apparatus.

Moreover, the fluorescent substances layer 8 is attached to the light reflecting surface 3b of the second reflection member 3 so as to stop up the opening portion of the second reflection member 3 through the use of a transparent member such as silicone resin, epoxy resin, or acrylic resin. In this case, no layer of air is created between the fluorescent substances layer 8 and the second reflection member 3, wherefore it is possible to prevent occurrence of reflection loss due to a refractive index difference posed by a layer of air. As a result, a larger quantity of the light emitted from the fluorescent substances layer 8 can be reflected from the second light reflecting surface 3b, and the optical power level of the light-emitting apparatus can be raised correspondingly.

Further, as shown in FIGS. 5A and 5B, in a case where an air gap 9 is provided between the upper surface of the light-transmittable member 5 and the lower surface of the fluorescent substances layer 8, part of the visible light produced within the fluorescent substances layer 8 and emitted to a downward direction is totally reflected from the interface between the lower surface of the fluorescent substances layer 8 and the air gap 9 in an upward direction. As a result, in the light-emitting apparatus, the quantity of visible light emitted upward from the fluorescent substances layer 8 is increased and thus the optical power level can be raised.

Figure 6:
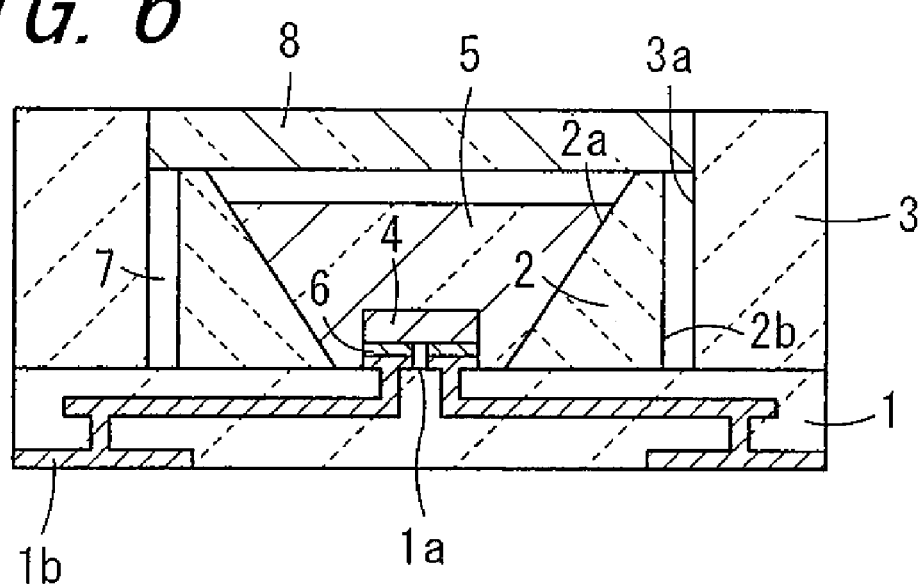
FIG. 6 is a sectional view showing a package for a light-emitting device and a light-emitting apparatus employing the same in accordance with a sixth embodiment of the invention.

Note that, in a case where the light-emitting apparatus effects emission of diffused light, as seen in FIG. 6 showing the cross section of the light-emitting apparatus in accordance with a sixth embodiment of the invention, the second reflection member 3 may be so configured that the height of the outer side surface is made same with or lower than the height of inner peripheral surface 3a and that part of the inner peripheral surface 3a which is located above the upper end of the first reflection member 2 is defined as the second light reflecting surface 3b. In this case, although the same light distribution control effect as achieved by the slanted surface, namely the second light reflecting surface 3b shown in FIGS. 5A and 5B cannot be attained, the light from the fluorescent substances layer 8 is allowed to radiate out of the light-emitting apparatus in a diffused state. That is, the intended effect can be accomplished successfully.

Moreover, it is preferable that the light-emitting device 4 is designed to give forth light at least in a range of from an ultraviolet region to a blue region. That is, in a case where a fluorescent substances is contained in the fluorescent substances layer 8, the fluorescent substances is allowed to effect wavelength conversion in a manner whereby to obtain fluorescent light which is longer in wavelength and lower in energy than the light from the light-emitting device 4 with enhanced wavelength conversion efficiency. Consequently, the optical power level of the light-emitting apparatus can be raised.

Note that the light emitted from the light-emitting device 4 in the ultraviolet region is regarded as an electromagnetic wave having a wavelength range whose upper limit and lower limit are approximately 360 to 400 nm and 1 nm, respectively, at the short wavelength end of visible light (based on Rikagaku Jiten (Physicochemical Dictionary), 5th ed., published by Iwanami Shoten). On the other hand, the light emitted from the light-emitting device 4 in the blue region is regarded as having a wavelength range whose lower limit and upper limit are approximately 360 to 400 nm and 495 nm, respectively, at the short wavelength end of visible light (based on chromaticity coordinates in XYZ color system according to JIS Z8701).

Figure 7:
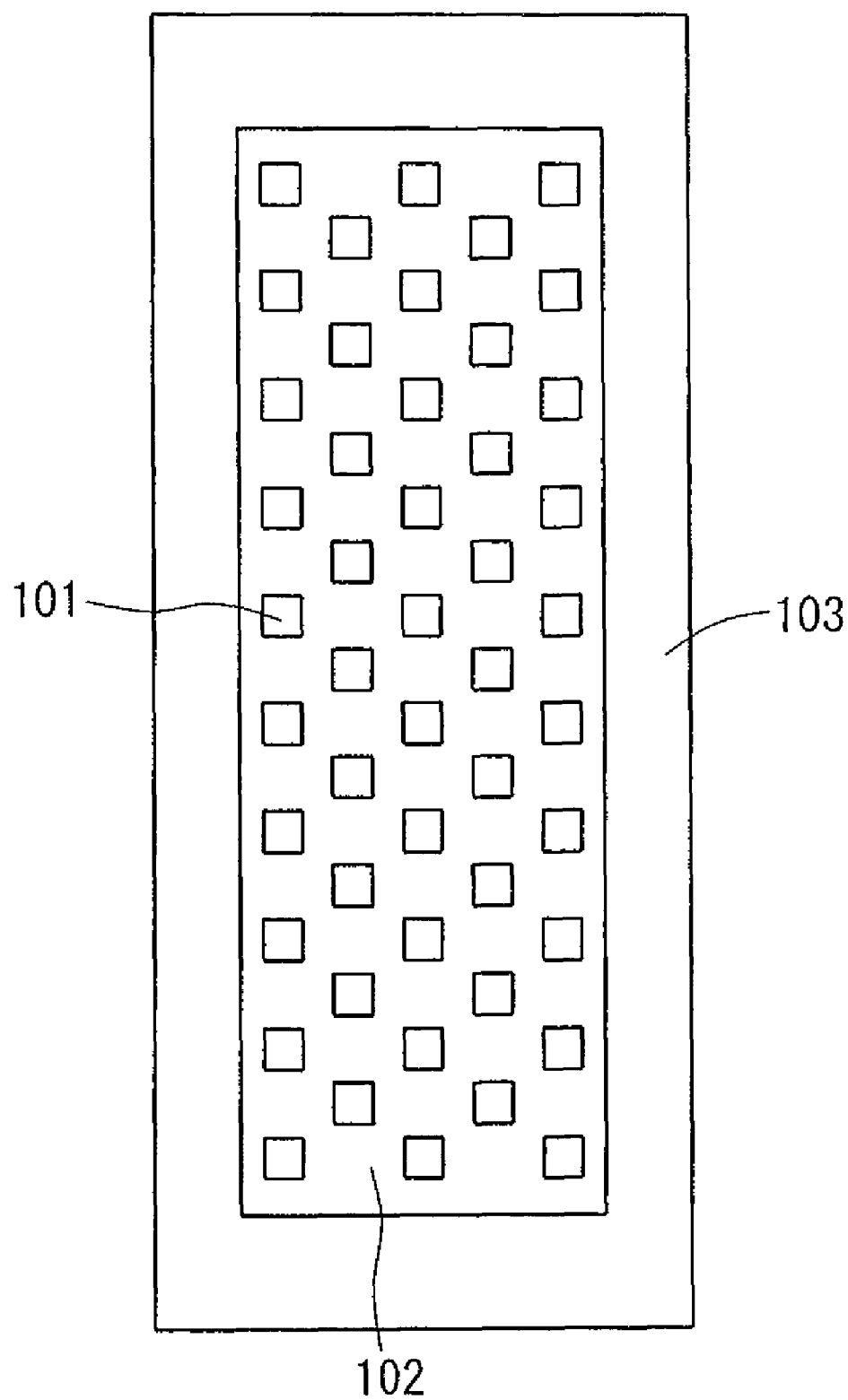
FIG. 7 is a plan view showing an illuminating apparatus in accordance with a seventh embodiment of the invention.
Figure 8:
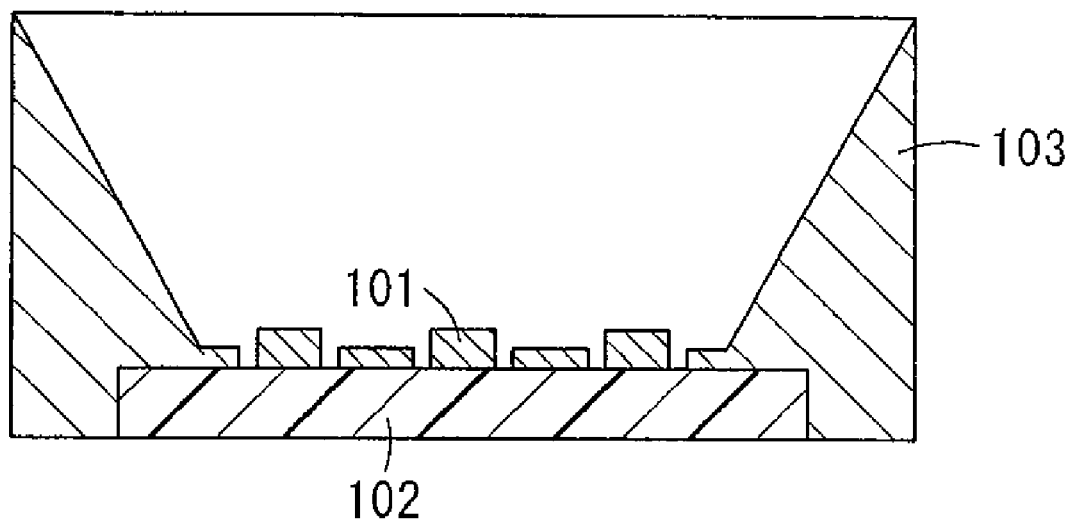
FIG. 8 is a sectional view of the illuminating apparatus shown in FIG. 7.
Figure 9:
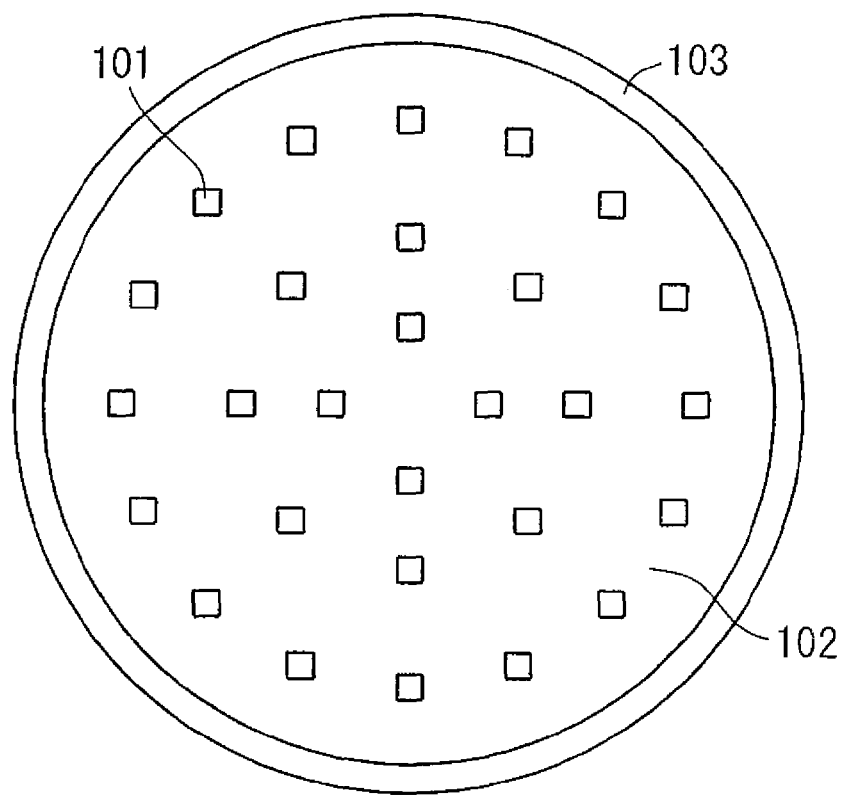
FIG. 9 is a plan view showing the illuminating apparatus in accordance with an eighth embodiment of the invention.
Figure 10:
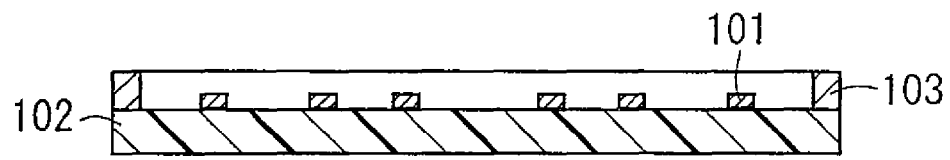
FIG. 10 is a sectional view of the illuminating apparatus shown in FIG. 9.

Next, FIG. 7 is a plan view showing the illuminating apparatus in accordance with a seventh embodiment of the invention, and FIG. 8 is a sectional view of the construction shown in FIG. 7. Moreover, FIG. 9 is a plan view showing the illuminating apparatus in accordance with an eighth embodiment of the invention, and FIG. 10 is a sectional view of the construction shown in FIG. 9. In FIGS. 7, 8, 9, and 10, the illuminating apparatus is composed of a light-emitting apparatus 101 of the invention, a driving section 102 having an electrical wiring for driving the light-emitting apparatus 101, and light reflecting means 103. In the figures, a reflection plate is illustrated by way of an example of the light reflecting means 103. For example, the reflection plate is formed of a metal plate or the like having the capability of reflecting the light emitted from the light-emitting apparatus 101 while making adjustment to attain a predetermined distribution of luminous intensity.

The illuminating apparatus of the invention incorporates the light-emitting apparatus 101 of the invention as a light source. For example, the light-emitting apparatus 101 of the invention is mounted on the driving section 102 in a predetermined arrangement (refer to FIGS. 7 and 9), and around them are disposed the light reflecting means 103 and so forth. The driving section 102 may be provided with a circuit for driving the light-emitting apparatus 101 that has the function of exercising power control for the light-emitting apparatus 101. In this case, the quantity of light to be emitted from the light-emitting apparatus 101 can be caused to vary. Moreover, the driving section 102 may be provided with a circuit having a pulse control function. In this case, it is possible to acquire the capability of allowing the light-emitting device 4 to blink in a short time, and also the total duration of time that light is being emitted from the light-emitting device 4 can be shortened under pulse control. This makes it possible to reduce the amount of power consumed by the illuminating apparatus, as well as to prolong the service life of the light-emitting device 4. Further, the driving section 102 may be provided with an overvoltage protective function. In this case, the light-emitting device 4 can be prevented from suffering from quality degradation and malfunction. This makes it possible to provide a long-lifespan, highly-reliable illuminating apparatus.

The illuminating apparatus of the invention may be provided with a plurality of the light-emitting apparatuses 101 as light sources. In this case, in order to avoid occurrence of differences in light intensity among the light-emitting apparatuses 101, the range of light distribution for which the second reflection member 3 is responsible is widened, and an optical lens or a platy light-transmittable lid body is bonded to be placed above the second reflection member 3 by means of solder, an adhesive, or otherwise, for the purpose of achieving light diffusion. This allows light to diffuse uniformly. As another advantage, it is possible to obtain an illuminating apparatus which exhibits a desired distribution of luminous intensity with little color unevenness. Preferably, there is provided a third reflection member 103 for covering all of the multiple light-emitting apparatuses 101. An optical lens or a platy light-transmittable lid body for producing a light-gathering effect and a light-diffusing effect may be bonded above the third reflection member 103 by means of solder, an adhesive, or otherwise. By doing so, it is possible to produce light at a desired radiation angle and with little color unevenness. Moreover, the resistance of the interior of the light-emitting apparatus 101 to intrusion of water can be enhanced, wherefore the illuminating apparatus will be excellent in long-term reliability. In addition, it is desirable to dispose a lens or a light-transmittable lid body in the opening portion of the reflection plate 103 of the illuminating apparatus.

It is to be understood that the application of the invention is not limited to the embodiments described heretofore, and that various changes and modifications of the invention are possible within the spirit and scope of the invention. For example, the first light reflecting surface 2a and/or the second light reflecting surface 3b may be configured as a curved surface. By exercising light distribution control over the light emitted from the light-emitting apparatus with such a curved surface, it is possible to effect radiation of highly directional light.

Moreover, an elastic member such as silicone resin may be disposed in the spacing 7. In this case, even if the first reflection member 2 and the second reflection member 3 undergo thermal expansion, ensuing effects can be accommodated by the elastic member. This helps protect the first reflection member 2 and the second reflection member 3 from deformation. Further, it is preferable that the outer peripheral surface 2b of the first reflection member 2 and the inner peripheral surface 3a of the second reflection member 3 are each circularly shaped as viewed plane-wise. By doing so, the stress and bending moment developed in each of the surfaces 2b and 3a can be dispersed uniformly. By virtue of the stress dispersion effect, occurrence of a crack and a deformation in the first and second reflection members 2 and 3 can be prevented with ease.

Moreover, by bonding an optical lens or a platy light-transmittable lid body, which allows the light outgoing from the light-transmittable member 5 and the light reflected from the second light reflecting surface 3b to condense or diffuse, to the upper surfaces of the first reflection member 2 and the second reflection member 3 by means of solder, an adhesive, or otherwise, it is possible for the light-emitting apparatus to produce light at a desired radiation angle. As another advantage, since the resistance of water to intrude into the interior of the light-emitting apparatus can be improved, it follows that the light-emitting apparatus offers enhanced long-term reliability. Note that expressions such as "upper-", "lower-", and "side-" which have been employed in the explanation of the embodiments are used simply to describe the relation in position among the constituent components only on the drawings, and there is no intention of defining the arrangement of the constituent components in actual use.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, in the package for a light-emitting device, the reflection member is divided into two pieces, namely the first and second reflection members. The second reflection member is attached to the upper surface of the base body so as to surround the first reflection member, with a spacing secured between the second reflection member and the outer peripheral surface of the first reflection member. In this construction, in spite of, for example, heating and cooling operations effected during the manufacturing process of the package or the heat which is generated during the operation of the light-emitting apparatus, the thermal expansions of the first and the second reflection members will be a little. Moreover, by virtue of the spacing interposed therebetween, the first and second reflection members suffers little from a thermal expansion-induced deformation and are thus free from mutual stresses. Accordingly, it is possible to suppress a stress and a bending moment due to the difference in thermal expansion coefficient between the base body and the first and second reflection members. Moreover, since the deformation resulting from the mutual actions of the first and the second reflection members can be accommodated by the spacing interposed therebetween, it is possible to suppress variation in distribution of luminous intensity in the light-emitting apparatus.

Moreover, the second light reflecting surface $3b$ is located upwardly of the first light reflecting surface. In this case, the area of the first light reflecting surface $2a$ and the area of the second light reflecting surface $3b$ can both accommodate a wider-area light reflecting surface, and the first and second light reflecting surfaces exercise light distribution control in a cooperative manner. This makes it possible to direct the light emitted from the light-emitting device 4 in an upward direction so as to radiate efficiently with a desired distribution of luminous intensity.

According to the invention, given the height of the first reflection member 2 of Y1, the height at the lower end of the light reflecting surface $3b$ of the second reflection member of Y2, and the height of the second reflection member of Y3, it is preferable that the following relationship holds: $Y2 \leq Y1 < Y3$. In this case, light distribution can be controlled by the second reflection member, whereby making it possible to attain a desired distribution of luminous intensity required of the light-emitting apparatus, and thus suppress variation in distribution of luminous intensity.

According to the invention, since the base body and the first reflection member are each made of ceramics, it is possible to reduce the difference in thermal expansion coefficient between the base body and the light-emitting device, and thereby suppress a stress between the base body and the light-emitting device due to the heat generated from the light-emitting device or the heat originating from the ambient conditions. Moreover, since the base body and the first reflection member are each made of ceramics, it is possible to suppress a stress at the joint portion between the base body and the first reflection member due to the difference in thermal expansion coefficient between the base body and the first reflection member, as well as to suppress a deformation in the first light reflecting surface due to such a stress. Besides, in this case, in contrast to the case of using resin to form the base body and the first reflection member, it is possible to avoid problems such as a deterioration in the reflectivity and water-repellent of the base substrate and the first light reflecting surface resulting from a moisture content and heat in the environment or the heat and light radiated from the light-emitting device. As a result, in the light-emitting apparatus, the light-emitting device can be operated stable while a optical power level can be maintained for a longer period of time.

According to the invention, since the base body and the first reflection member are each made of ceramics of light color or whitish color, it is possible for the reflection member to achieve efficient light reflection in a range of from an ultraviolet region to a visible light region, with lesser degree of wavelength dependence. As a result, the light-emitting apparatus is capable of emitting light while variation in optical power level and color alteration can be suppressed.

According to the invention, being made of aluminum, the second reflection member suffers little from a change in reflectivity by virtue of an oxidation layer produced by the effect of passivation. This makes it possible to manufacture a light-emitting device housing package which allows efficient radiation of the light emitted from the light-emitting device, with little decline in reflectivity under the influence of operating environment. Moreover, in the case of using aluminum, the dependence of reflectivity on wavelength in a range of from an ultraviolet region to a visible light region is so low that there is little decline in reflectivity with respect to light in a range of from an ultraviolet region to a near-ultraviolet region or a blue region. Further, it is possible to prevent a decline in reflectivity resulting from corrosion which is caused by a moisture content and oxygen existing in the operating environment, and thereby prevent a reduction in optical power level and a deterioration in long-term reliability in the light-emitting apparatus.

Moreover, with the use of the aluminum-made second reflection member, for example, in the case of using the light-transmittable first reflection member made of sintered aluminum oxide or the like material, it is possible to cut off light which leaks outside of the light-emitting apparatus after passing through the side surface of the first reflection member. By doing so, when the light-emitting apparatus is used as a light source for display purposes, a higher degree of contrast can be ensured between the light-emissive surface and the non-light-emissive surface of the light-emitting apparatus. This makes it possible to manufacture a high-visibility light-emitting apparatus for use as a display light source. Further, in a case where the light-emitting device is designed to give forth light in a range of from a blue region to an ultraviolet region, high-energy light transmitted through the first reflection member can be cut off. This makes it possible to manufacture a light-emitting apparatus which offers excellent environmental safeness without causing quality degradation in the surrounding members which are susceptible to deterioration from light.

According to the invention, the light-emitting apparatus is constructed by mounting the light-emitting device on the mounting portion of the package of the invention, and disposing the light-transmittable member so as to cover the light-emitting device. In this construction, stable optical characteristics can be attained.

According to the invention, the light-emitting apparatus is composed of the package of the invention, the light-emitting device mounted on the mounting portion, and the fluorescent substances layer attached to the second reflection member so as to stop up the opening portion of the second reflection member 3. The wavelength of light emitted from the light-emitting device is partly or wholly converted by the fluorescent substances layer. In this construction, it is possible to prevent a deterioration in the characteristics of the fluorescent substances layer resulting from the heat liberated by the light-emitting device. That is, in the case of arranging the fluorescent substances layer in the opening portion of the second reflection member, as compared with the case of arranging the fluorescent substances layer inside the first reflection member or arranging it so as to stop up the opening portion thereof, the path through which heat is dissipated from the light-emitting device to the fluorescent substances layer is so long that the heat resistance is increased. Moreover, the path through which heat is dissipated from the light-emitting device to the fluorescent substances layer via the first reflection member is blocked by the spacing. Accordingly, heat is inhibited from propagating from the light-emitting device to the fluorescent substances layer readily. As a result, even in the case of using epoxy resin, acrylic resin, or the like material as the transparent member containing a fluorescent substances, it is possible to prevent the transparent resin from becoming yellowish due to heat application, as well as to prevent a decline in transmissivity. It is also possible to prevent a deterioration in optical power level resulting from heat-induced acceleration of chemical reactions such as an oxidation-reduction reaction in the fluorescent substances charged in the fluorescent substances layer.

According to the invention, the light-emitting device is designed to give forth light at least in a range of from an ultraviolet region to a blue region. Therefore, in a case where a fluorescent substances which gives forth fluorescent light after being excited by the light emitted from the light-emitting device is contained in the fluorescent substances layer for effecting wavelength conversion on the light emitted from the light-emitting device, with the light from the light-emitting device that is short-wavelength, high-energy light at least in a range of from an ultraviolet region to a blue region, the fluorescent substances is allowed to effect wavelength conversion in a manner whereby to obtain fluorescent light which is longer in wavelength and lower in energy than the light from the light-emitting device. This makes it possible to enhance the efficiency with which the fluorescent substances effects wavelength conversion, and thereby raise the optical power level of the light-emitting apparatus.

According to the invention, the illuminating apparatus is composed of the light-emitting apparatus of the invention, the driving section on which is mounted the light-emitting apparatus, which has an electrical wiring for driving the light-emitting apparatus, and the light reflecting means for reflecting the light outgoing from the light-emitting apparatus. With such a structure, the illuminating apparatus is capable of exhibiting a desired distribution of luminous intensity and thus offering stable optical characteristics with little color unevenness.

The invention claimed is:

1. A package for a light-emitting device comprising:
a base body having a mounting portion on its upper surface for mounting a light-emitting device;
a frame-shaped first reflection member attached to the upper surface of the base body, an inner peripheral surface of which is shaped into a first light reflecting surface and surrounds the mounting portion; and
a frame-shaped second reflection member attached to the upper surface of the base body,
and an air gap between an inner peripheral surface of the second reflection member and an outer peripheral surface of the first reflection member, wherein the inner peripheral surface surrounds the first reflection member and has a second light reflecting surface coaxial with the first reflecting surface at a location above an upper end of the first reflection member.

2. The package for a light-emitting device of claim 1, wherein the height of the first reflection member of Y1, the height at the lower end of the second light reflecting surface of Y2, and the height of the second reflection member of Y3 are given, then the following relationship holds: $Y2 \leqq Y1 < Y3$.

3. The package for a light-emitting device of claim 1, wherein the base body and the first reflection member are each formed of ceramics, and the second reflection member comprises aluminum.

4. The package for a light-emitting device of claim 3, wherein the base body and the first reflection member each comprise ceramics of light color.

5. The package for a light-emitting device of claim 1, wherein the second reflecting surface shows regular reflectivity.

6. The package for a light-emitting device of claim 1, wherein the inner peripheral surface of the second reflection member is vertically attached to the upper surface of the base body, and wherein the second light reflecting surface is located above the inner peripheral surface of the second reflection member and is shaped into a slanted surface whose upper end extends beyond the lower end thereof.

7. A light-emitting apparatus comprising:
the package for a light-emitting device of claim 1;
a light-emitting device mounted on the mounting portion; and
a light-transmittable member disposed inside the first reflection member so as to cover the light-emitting device.

8. A light-emitting apparatus comprising:
the package for a light-emitting device of claim 1;
a light-emitting device mounted on the mounting portion; and
a fluorescent layer attached to the first reflection member, wherein the first reflection member comprises an opening portion which the fluorescent layer stops up.

9. A light-emitting apparatus comprising:
the package for a light-emitting device of claim 1;
a light-emitting device mounted on the mounting portion; and
a fluorescent layer attached to the second reflection member, wherein the second reflection member comprises an opening portion which the fluorescent layer stops up, for effecting wavelength conversion on a part or the whole of light emitted from the light-emitting device.

10. An illuminating apparatus comprising:
the light-emitting apparatus of any one of claims 7 to 9;
a driving section on which is mounted the light-emitting apparatus, which has an electrical wiring for driving the light-emitting apparatus; and
a light reflector which reflects light emitted from the light-emitting apparatus.

11. The light-emitting apparatus of claim 8 or 9, wherein the light-emitting device is designed to give forth light in a range of at least from an ultraviolet region to a blue region.

12. A light-emitting apparatus comprising:
a package comprising:
a base body comprising a mounting portion on its upper surface configured for mounting a light-emitting device;
a frame-shaped first reflection member attached to the upper surface of the base body, an inner peripheral surface of which is shaped into a first light reflecting surface and surrounds the mounting portion; and
a frame-shaped second reflection member attached to the upper surface of the base body, with a spacing between an inner peripheral surface of the second reflection member and an outer peripheral surface of the first reflection member, the inner peripheral surface surrounding the first reflection member and having a second light reflecting surface which is coaxial with the first reflecting surface, at a location above an upper end of the first reflection member;
a light-emitting device mounted on the mounting portion; and
a light-transmittable member inside the first reflection member so as to cover the light-emitting device,
wherein the light-transmittable member is not within the spacing.

13. A light-emitting apparatus comprising:
a package comprising:
- a base body comprising a mounting portion on its upper surface configured for mounting a light-emitting device;
- a frame-shaped first reflection member attached to the upper surface of the base body, an inner peripheral surface of which is shaped into a first light reflecting surface and surrounds the mounting portion; and
- a frame-shaped second reflection member attached to the upper surface of the base body, with a spacing between an inner peripheral surface of the second reflection member and an outer peripheral surface of the first reflection member, the inner peripheral surface surrounding the first reflection member and having a second light reflecting surface which is coaxial with the first reflecting surface, at a location above an upper end of the first reflection member;

a light-emitting device mounted on the mounting portion; and
a fluorescent layer attached to the second reflection member, wherein the second reflection member comprises an opening portion which the fluorescent layer stops up, for effecting wavelength conversion on a part or the whole of light emitted from the light-emitting device,
wherein the fluorescent layer is not within the spacing.

14. A light-emitting apparatus comprising:
a package comprising:
- a base body comprising a mounting portion on its upper surface configured for mounting a light-emitting device;
- a frame-shaped first reflection member attached to the upper surface of the base body, an inner peripheral surface of which is shaped into a first light reflecting surface and surrounds the mounting portion; and
- a frame-shaped second reflection member attached to the upper surface of the base body, with a spacing between an inner peripheral surface of the second reflection member and an outer peripheral surface of the first reflection member, the inner peripheral surface surrounding the first reflection member and having a second light reflecting surface which is coaxial with the first reflecting surface, at a location above an upper end of the first reflection member;

a light-emitting device mounted on the mounting portion; and
a fluorescent layer attached to the first reflection member, wherein the first reflection member comprises an opening portion which the fluorescent layer stops up,
wherein the fluorescent layer is not within the spacing.

15. An illuminating apparatus comprising:
the light-emitting apparatus of any one of claims 12 to 13;
a driving section on which the light-emitting apparatus is mounted, the driving section having an electrical wiring for driving the light-emitting apparatus; and
a light reflector which reflects light emitted from the light-emitting apparatus.

* * * * *